United States Patent [19]

Haga

[11] Patent Number: 4,631,479
[45] Date of Patent: Dec. 23, 1986

[54] ERROR LOCATOR FOR HIGH-SPEED INSPECTION OF MAGNETIC TAPE

[75] Inventor: Hirokazu Haga, Euless, Tex.

[73] Assignee: Graham Magnetics Inc., North Richland Hills, Tex.

[21] Appl. No.: 486,191

[22] Filed: Apr. 18, 1983

[51] Int. Cl.⁴ .................... G01R 33/12; G01N 27/72; G11B 27/36; B08B 7/00
[52] U.S. Cl. .................................. 324/212; 324/226; 134/9; 360/31
[58] Field of Search ............................. 324/210-212, 324/226; 371/15, 21; 360/25, 31, 74.2, 72.2, 72.3; 15/308; 134/9; 377/17-20

[56] References Cited

U.S. PATENT DOCUMENTS

| | | | |
|---|---|---|---|
| 3,370,982 | 2/1968 | Hayunga | 324/212 |
| 3,684,213 | 8/1972 | Golden | 377/18 |
| 3,736,499 | 5/1973 | Major et al. | 324/210 |
| 4,095,732 | 6/1978 | Merritt | 360/72.3 |

Primary Examiner—Ernest F. Karlsen
Assistant Examiner—Walter E. Snow
Attorney, Agent, or Firm—Andrew F. Kehoe

[57] ABSTRACT

A novel tape testing apparatus of the type which senses errors, stops the tape, and causes the error to be moved to an error-correction or an error-inspection station. The apparatus of the invention is characterized by means to rapidly try to remove the error by additional passes through an error removal station and then, if necessary bring the error-bearing portion of the tape precisely under an inspection station by a precise distance-metering process.

7 Claims, 3 Drawing Figures

ERROR LOCATOR FOR HIGH-SPEED INSPECTION OF MAGNETIC TAPE

BACKGROUND OF THE INVENTION

This invention relates generally to the high-speed inspection of any tape product where errors are sensed and returned to an inspection or correction station before proceeding with the inspection.

More particularly the invention relates to improved process and apparatus for inspecting magnetic recording tape, particularly digital (computer) tape.

The following description of the prior art is necessarily made with hindsight of the invention described for the first time in the Specification appearing below. Therefore, it is to be understood that the insights into the limitations of the prior art described herein are not to be taken to be part of the prior art as it was known prior to the present invention.

Magnetic tape, especially digital magnetic tape of the type used in computer memory applications, is a well-known product of commerce. Such tape is used in maintenance of critical business records. Any defect in the tape may cause serious problems for the company which is relying upon the accuracy of the information which has been magnetically recorded on the tape. Consequently, such computer tape is always inspected to assure its compliance with the required high standards of quality. Indeed, much of the computer tape sold is certified by the supplier to be error free.

The inspection of computer tape is normally carried out at high speed, e.g. 200 inches per second or higher. Typically, the tape is cleaned under a scraper blade and then passed under a read/write head. "Test Data" is written magnetically on the tape by a write head and, immediately, the data is read by a read head. The read head is used to confirm that the test data can be both written upon and recovered from the magnetic tape. When the data to have been written is not present, the read head has detected an error, and the error-bearing situs of the tape must be returned to an "inspection station" or to a station at which the tape is subjected to some remedial steps. The remedial steps may include another or different automatic scraping in an attempt to remove the defect mechanically or they may include the manual removal of a defect by a skilled person who views the defect under a microscope. In any event, but in particularly in the latter situation, it is desirable that the defect in the tape be placed precisely at the desired position, e.g. directly under the microscope.

In the past, the movement of the tape has been achieved by timing the required movement. By this is meant that the apparatus would move the tape segment bearing the error into the inspection station by moving it for a time which would, theoretically, position it precisely at the desired location. However, very frequently the tape would fall outside the area in which a worker could view the tape. This was particularly true if movement under the station followed a plurality of attempts to remove the defect under a mechanical scraping station. The site of the error would simply become "lost" and it would be time consuming for a worker to find it. Attempts to avoid this problem have been met with limited success. Attention to mechanical problems, such as slippage of the tape or gears associated with the apparatus has not solved the problem.

The error-bearing portion of the tape might be out of position by a significantly large fraction of an inch, i.e. 0.5 of an inch, or even one inch. Generally, operators would rather move the tape error into the inspection position by hand than rely upon the time-consuming recall procedure.

A Control Data Corporation Model 686 tape certifying apparatus is typical of the prior art inspection devices.

SUMMARY OF THE INVENTION

Therefore, it is a principal object of the invention to provide an improved magnetic tape-inspecting process and inspection apparatus for use therein.

However, it is also an object of the invention to provide an improved coating inspection apparatus for use with coated sheet stock.

Another object of the invention is to provide a tape inspecting apparatus which allows the rapid precise positioning of a tape error situs under an inspection station or in a repair station even after the tape has been stopped and moved to and fro within the apparatus several times.

A further object of the invention is to provide an improved inspection apparatus as described above that is thermally stable.

Other objects of the invention will be obvious to those skilled in the art on their reading of the invention.

The above objects have been substantially achieved by utilizing a positive measurement of tape displacement utilizing an optical tachometer associated with the tape drive or other such optical encoding device which can positively measure the displacement of a web site as it is moved electronically from place to place. The exact stopping place of the tape is suitably established by measuring the turns of a capstan after the stop signal is given or detection of an error at a point A as seen in FIG. 2. The tape stopping place may be defined as point B and the "forward inertial distance" as AB. The tape can then be reversed for the proper distance to a point before the cleaning station or to a point at an inspection station. Proper distance will be the distance AB plus the distance between the original stop signal back to the cleaning station or other desired return position. Even during reversal, however, it is necessary to measure the "rearward inertial" movement of the tape after the stop signal is given, because the tape will again tend to continue past the desired stop point. However, once the error in the rearward inertial movement is accounted for, it is possible for the tape to proceed forward again for a known distance until the point of the original error reaches the error-detecting site.

Although there are web processing systems wherein the inertial effects are primary and it is particularly easy to discuss the invention with respect to such inertial effects, it should be realized that, in high-precision apparatus like modern magnetic-tape drive apparatus, the primary source of wandering of a point on the web is more likely to be caused by subtle variations in electronic signals caused by temperature variation or the like. In any event, the apparatus of the invention functions much as it would were inertia the only problem contributing to the errant response of a position on the tape to a stop signal.

If the error remains, test apparatus is normally so controlled that the apparatus will repeat, at least one more time, the passage past the cleaning device. Only after the error fails to respond to the prescribed number of cleaning passes will the error be considered irreparable. Even then, it can be programmed according to the above defined procedure to return the tape directly under an inspection station where manual correction by inspection personnel is done.

Thus, the present invention describes a process and apparatus for inspecting and refurbishing a web, such as magnetic tape, whereby a fault in the tape coating can be repeatedly stopped and moved to and fro to, or through, inspection stations and fault-repairing stations while keeping track of the exact position of the fault. While it is not mandatory to do so, the present apparatus can track, and respond to, fault movement in such a way that the position of the fault is tracked within 0.02 of an inch of a given spot along the tape path.

ILLUSTRATIVE EXAMPLES OF THE INVENTION

In this application and accompanying drawings there is shown and described a preferred embodiment of the invention and suggested various alternatives and modifications thereof, but it is to be understood that these are not intended to be exhaustive and that other changes and modifications can be made within the scope of the invention. These suggestions herein are selected and included for the purposes of illustration in order that others skilled in the art will more fully understand the invention and the principles thereof and will be able to modify it and embody it in a variety of forms, each as may be best suited to the condition of a particular case.

IN THE DRAWINGS

Figure 1:
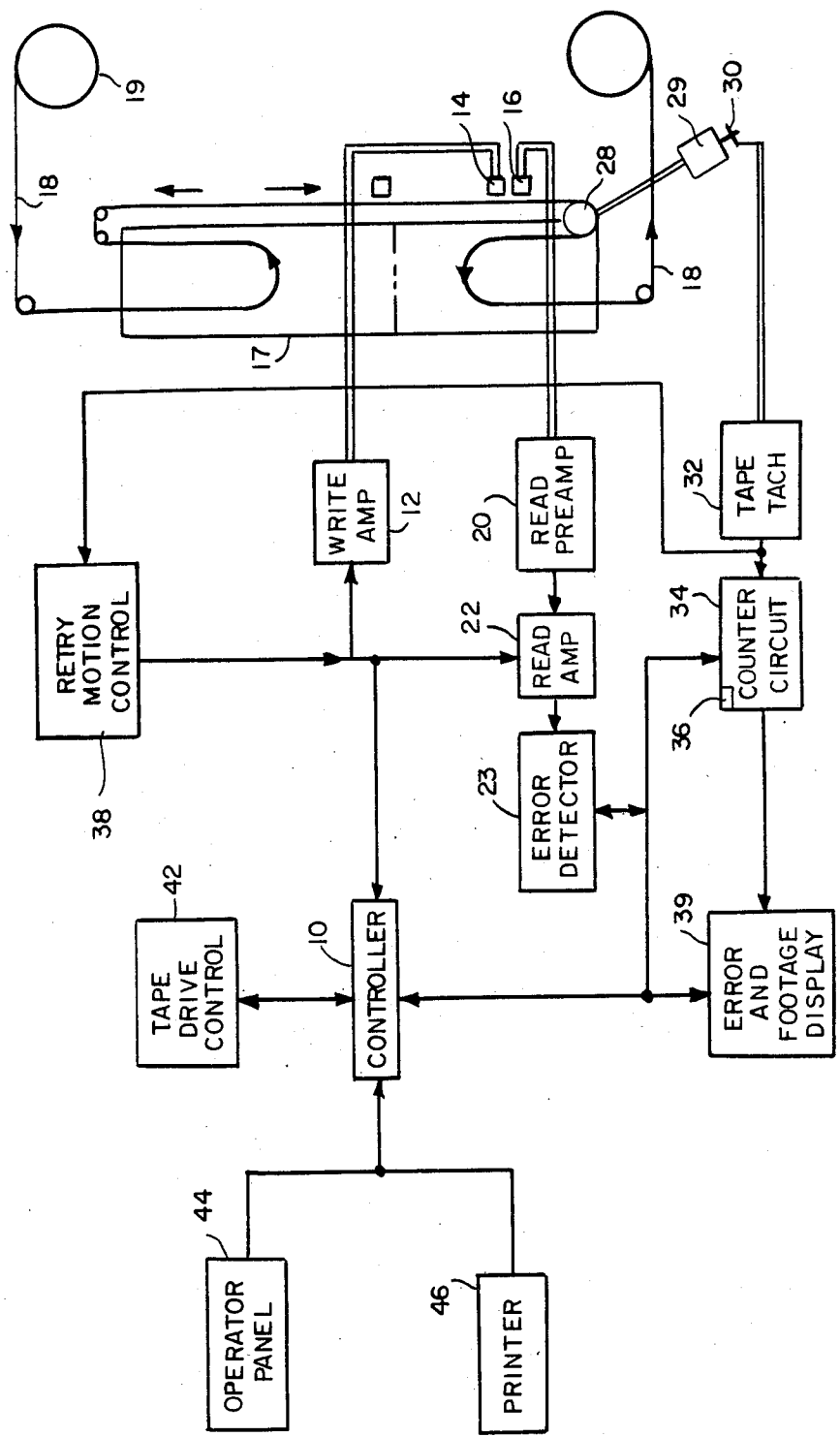
FIG. 1 is a block and schematic diagram of a system embodying the invention.

Referring to FIG. 1, it is seen that the system of the invention is described with connecting lines illustrative of communications between its various components. As will be evident to those skilled in the art, the lines evidence communications along address bus, data bus, and communication lines.

A microprocessor 10 forms a central data-processing unit (CPU). On its command, write amplifier 12 writes data patterns on, typically, 9 (nine) channels of the tape. The actual data patterns are placed on the tape by a magnetic write head 14.

A read head 16 senses the magnetic signal data as tape 18 passes from the write head 14 under the read head 16. The signals read by read head 16 are amplified through a read preamp 20 and further amplified and digitized by a read amp 22 before being passed to an error detector 23. The error detector 23, which generates an error signal when an error is detected, may be of the type described in U.S. Pat. No. 4,255,807 and sold by Graham Magnetics, Incorporated, under the trademark Inspector IV.

It will be seen that the tape 18 being inspected is fed from a supply wheel 19 through a vacuum take-up chamber 17 and under a cleaning station 24. In the description herein, it will be realized that the cleaning station 24 is a sharp scraping blade. However, the cleaning station may include, offset from the scraper blade by some inches, an optical inspection station as seen at 26.

The system as described immediately above is generally known in the art. This invention relates primarily with what is done with the tape and error signal to substantially improve the efficiency of the tape inspection operation.

It will be noted that tape 18 moves in contact with a roller 28, which is driven by a drive motor 29. The contact between roller 28 and tape 18 is slip-free so the circumferential movement of the surface of the roller 28, or the rotation of its drive motor 29, is a positive indication of the linear movement of the tape. This movement of roller 28 is sensed by a tape tachometer 30. Tachometer 30 feeds two analog signals in phase quadrature, i.e. 90 degrees out of phase with one another, to tape tach circuitry 32. The analog signals from the tachometer 30 are converted to digital signals in tape tach circuitry 32 and fed to a counter circuit 34. In the illustrated embodiment, by way of example, the digital signals generated by tape tach circuitry 32 are in the form of pulse signals occurring at the rate of 50 pulses per inch of tape movement. Counter circuit 34 comprises a footage pulse generator 36 and a programmable retry counter 38. Both receive pulses from the tape tach circuitry 32. Footage pulse generator 36 converts the 50 pulses per inch into 1 pulse per foot to generate a footage pulse to increase the footage counter on an error and footage read out 39. The programmable retry counter 38 receives the 50-pulse-per inch signals to decrement numbers stored in an internal 16-bit counter and thereby keeps track of an error location during a retry operation.

A tape drive control 42 receives commands to start or stop from the controller 10, executes such signals, and informs the controller of the tape drive status by various status signals. An operator panel 44 and a printer 46 serve the purpose generally known for such devices. The operator panel 44 provides means for the operator to inform the controller 10 of the desired mode of operation through the front control panel, e.g. the operator may set the process for two or four repeats in attempting to eradicate an error before the error is recorded by error detector 23 as a "permanent" error or before the error is returned to optical inspection station 26 for attention by a trained operator.

In view of the teachings in the present application, implementation of the process of the invention will be readily carried out by those skilled in the art of digital signal processing.

Figure 3:
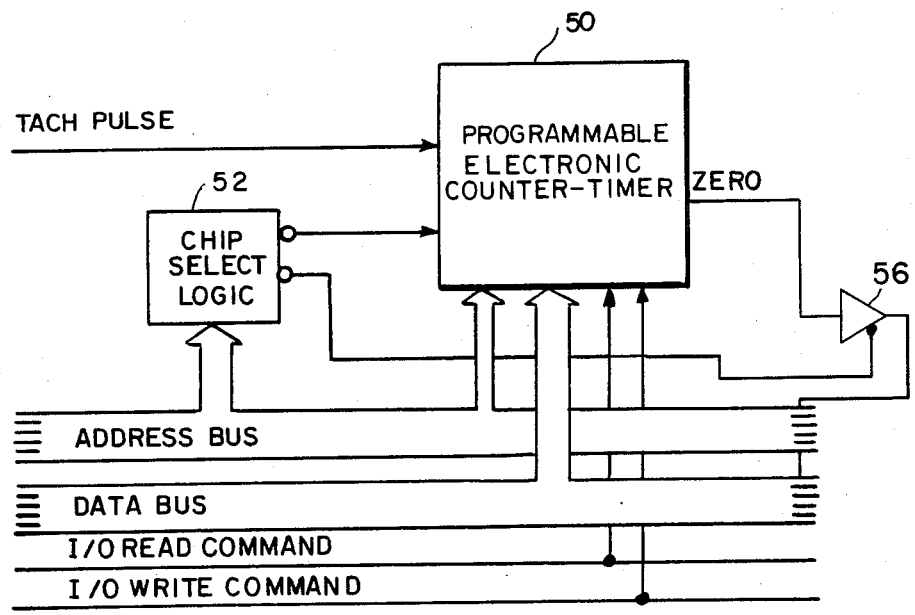
FIG. 3 is a schematic diagram indicative of the preferred retry motion control circuitry used in the apparatus of the invention.

Nevertheless, one particularly advantageous aspect of the illustrative procedure taught by Applicant is disclosed in FIG. 3 wherein the retry motion control circuitry is shown to include a programmable electronic counter-timer 50 and a chip select logic 52. Programmable counter-timer 50 is preprogrammed into a binary count mode. When the tape 18 is moving, the tach pulse signals from tape tach circuitry 32 are received by counter-timer 50, which starts to track the tape movement, for example by decrementing towards zero a number representing an initial value. Any loading of a new number into the counter-timer 50 is done by the CPU 10 through the data bus.

Chip-select logic circuit 52 is utilized to select the appropriate connection to the common data bus so that the CPU 10 can perform whatever input or output operation (e.g. reading data from, or writing data into I/O chips in the counter-timer 50, the CPU and other chips connected to the data bus) is appropriate at a given time. Time indication signals, denoted ZERO in FIG. 3, are applied to a 3 state high impedance bus driver 56. An enable signal generated by chip select 52 is fed to bus driver 56. In the illustrated embodiment, by way of example, when the enable signal is high, bus driver 56 is in the high impedance mode and the input terminals are isolated from the output terminals. A low enable signal allows gating the input signal to the data bus.

Figure 2:
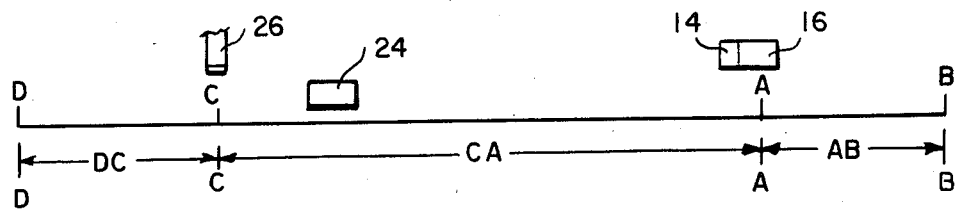
FIG. 2 is a schematic diagram showing the control procedure as it is applied to a tape under inspection.

Operation of the apparatus is described with reference to FIGS. 1 and 2. In a typical operation, as seen in FIG. 1, tape 18 is moving at a linear speed of about 200 inches per second along a path beneath cleaning station 24 and read/write head assembly 16/14. When there is a fault in the tape 18, it will be detected at point A by the read head 16. The CPU 10, on receiving report of the error, immediately signals a stop to the tape drive 29 and also informs counter circuit 34. An instantaneous stop is neither desirable nor practical. Thus the tape 18 will not stop until sometime after the error moves past error-detection point A. In FIG. 2, the tape 18 stops at point B. During the stop time, that is, the time during which the error moves from A to B, the counter circuit 34 has counted the pulses at the rate of 50 pulses per inch and "knows" precisely the location of the sensed defect.

In one convenient mode of tape 18 inspection, it is desirable to return the tape for another pass under the cleaning head. Before this is done, the CPU 10 adds the distance AB to AC, a known distance which would bring the tape fault from the detection point A to a point C in front of the inspection station 26. It is convenient if this point C corresponds to an optical inspection station 26 if provision for optical inspection is included in the operation. In any event, through CPU 10 the new number representing distance BC is loaded into the counter-timer 50 and programs it into a decrement mode reversing the tape 18 through distance BC, i.e. for the number of tach pulses representative of distance BC.

However, when the fault reaches C, it will not stop at a precise point. The inertia of the system causes the tape 18 to continue to move, e.g. from C to D just as it has earlier moved from A to B. (It may not be assumed, however, that distance CD will equal distance AB.) As in the case of the move from A to D, the distance from C to D is measured. The CPU 10 issues a stop command when the fault reaches C and programs the counter-timer 50 to count pulses of the stop distance CD.

The error is now at point D. Again, the number in the counter-timer 50 which is representative of CD is added to preset counter number representative of distance CA and, again in decrement mode, the tape 18 is "retried" by being passed under cleaning station 24 as it moves along path DA.

If the error survives this second pass through the cleaning station 24, CPU 10 detects the error at the read head 16 before the move count reaches zero.

If desired, the apparatus can be programmed for a number of passes beneath the cleaning station 24. If this is done, the inertial movement past points A, as the tape moves to the right in FIG. 2, or past point C, as the tape moves to the left in FIG. 2, are measured as before and added to the preset distance so that the apparatus can always "know" the location of the error.

If after a programmed number of attempts to remove the error with the cleaning station 26, it is desired to visually inspect the item, the tape 18 can be slowed down and brought precisely under the optical station 24 by counting the pulses as described above.

It is also to be understood that the following claims are intended to cover all of the generic and specific features of the invention herein described and all statements of the scope of the invention which might be said to fall therebetween.

What is claimed:

1. A process for inspecting magnetic recording tape on inspection apparatus, said process being suitable for use at tape speeds of 200 inches per second and comprising the steps of:
   (a) passing the tape through the cleaning station and a write-read head for detecting faults in recording properties of said tape and maintaining precise information on the position of said faults as the tape is moved to and fro with respect to said station;
   (b) sending a first stop signal to said tape drive in response to detection of a magnetic recording fault on said tape;
   (c) counting digital pulses, derived from the output of a tape drive tachometer, as a function of forward inertial movement of said tape between the time recording fault is sensed and the time the tape actually stops, and electronically storing by digital processing thereof said pulse count as a precise indication of the position of said fault relative to said apparatus;
   (d) moving said tape backwards for a distance which is equal to said forward inertial movement plus a distance sufficient to place said fault in a return position for another passage through said cleaning station;
   (e) then stopping said tape for a second time with a second stop signal;
   (f) again counting said pulses as a function of rearward inertial movement after said second stop signal, again digitally processing and storing said pulses as a precise indication of the position of said fault;
   (g) proceeding with a second passing of said tape through said cleaning station and then through said write-read head determining if said magnetic recording fault is still present, and
   (h) repeating steps (b) through (g) at least one time if said fault is still present.

2. A process as defined in claim 1 wherein said pulses are digital pulses derived from an optical tachometer, and which are generated at about 50 pulses per inch of tape travel during inertial movement and digitally processed and stored and in electronic counter in conjunction with count data representative of said predetermined distance, utilizing said counter data to control said tape drive and assuring the tape may be repeatedly moved back and forth between said write-read head and return position while keeping the exact position of said fault with respect to said cleaning station known in said counter.

3. A process as defined in claim 1 comprising the step of bringing said fault under an optical inspection station within a error of plus or minus 0.02 of an inch.

4. In apparatus for inspecting and refurbishing the coating of a continuous, coated web, said apparatus comprising:
   (a) means to detect a fault in said coating;
   (b) means to stop said web after it has passed fault-detecting means;
   (c) means to refurbish said coating at the point of said fault; and
   (d) means to return any fault detected on said web to a return position where it may be passed again through said refurbishing means;

(e) the improvement wherein said apparatus comprises electronic means to track the exact position of said fault and to compensate for inertial of the web on stopping and starting providing a tracking of the position of said fault through a repetitive number of attempts to refurbish said coating, said electronic means comprising a web-drive tachometer, and digital counting means to count and store digital pulses derived from the output of said tachometer as a function of the position of said tape.

5. Apparatus as defined in claim 4 wherein said refurbishing means is a scraping tool.

6. Apparatus as defined in claim 4 wherein said return position is an inspection position, said means to return is accurate within about 0.05 inch.

7. Apparatus as defined in claim 6 wherein said refurbishing means is a scraping tool.

* * * * *